(12) United States Patent
Barron et al.

(10) Patent No.: US 7,253,014 B2
(45) Date of Patent: Aug. 7, 2007

(54) FABRICATION OF LIGHT EMITTING FILM COATED FULLERENES AND THEIR APPLICATION FOR IN-VIVO LIGHT EMISSION

(75) Inventors: Andrew R. Barron, Houston, TX (US); Dennis J. Flood, Oberlin, OH (US); John Ryan Loscutova, Houston, TX (US)

(73) Assignees: William Marsh Rice University, Houston, TX (US); Newcyte, Inc., Oberlin, OH (US)

( * ) Notice: Subject to any disclaimer, the term of this patent is extended or adjusted under 35 U.S.C. 154(b) by 0 days.

(21) Appl. No.: 10/534,452

(22) PCT Filed: Nov. 19, 2003

(86) PCT No.: PCT/US03/37188

§ 371 (c)(1),
(2), (4) Date: Nov. 1, 2005

(87) PCT Pub. No.: WO2004/046023

PCT Pub. Date: Jun. 3, 2004

(65) Prior Publication Data

US 2006/0148272 A1  Jul. 6, 2006

Related U.S. Application Data

(60) Provisional application No. 60/427,533, filed on Nov. 19, 2002.

(51) Int. Cl.
*H01L 21/00* (2006.01)

(52) U.S. Cl. .......................... 438/34; 438/46; 438/483; 977/547

(58) Field of Classification Search ............ 438/22–47, 438/479–509; 977/542–848; 427/402, 407
See application file for complete search history.

(56) References Cited

U.S. PATENT DOCUMENTS

| | | | |
|---|---|---|---|
| 5,690,807 A * | 11/1997 | Clark et al. .................. | 205/655 |
| 6,126,740 A | 10/2000 | Schulz et al. | |
| 6,277,766 B1 | 8/2001 | Ayers | |
| 6,348,295 B1 | 2/2002 | Griffith et al. | |
| 6,685,986 B2 | 2/2004 | Oldenburg et al. | |
| 6,710,366 B1 | 3/2004 | Lee et al. | |
| 6,970,239 B2 * | 11/2005 | Chan et al. .................. | 356/301 |
| 2003/0034486 A1 | 2/2003 | Korgel | |
| 2003/0234978 A1 * | 12/2003 | Garito et al. ............ | 359/341.5 |
| 2004/0108298 A1 * | 6/2004 | Gao ........................... | 216/13 |

* cited by examiner

*Primary Examiner*—Savitri Mulpuri
(74) *Attorney, Agent, or Firm*—Conley Rose, P.C.

(57) ABSTRACT

A nanoparticle coated with a semiconducting material and a method for making the same. In one embodiment, the method comprises making a semiconductor coated nanoparticle comprising a layer of at least one semiconducting material covering at least a portion of at least one surface of a nanoparticle, comprising: (A) dispersing the nanoparticle under suitable conditions to provide a dispersed nanoparticle; and (B) depositing at least one semiconducting material under suitable conditions onto at least one surface of the dispersed nanoparticle to produce the semiconductor coated nanoparticle. In other embodiments, the nanoparticle comprises a fullerene. Further embodiments include the semiconducting material comprising CdS or CdSe.

17 Claims, No Drawings

FABRICATION OF LIGHT EMITTING FILM COATED FULLERENES AND THEIR APPLICATION FOR IN-VIVO LIGHT EMISSION

STATEMENT REGARDING FEDERALLY SPONSORED RESEARCH OR DEVELOPMENT

Not applicable.

BACKGROUND OF THE INVENTION

1. Field of the Invention

This invention relates to the field of fullerenes and more specifically to the field of coating fullerenes with coatings capable of emitting and/or absorbing light.

2. Background of the Invention

Nanoparticles have been increasingly studied due to their physical and chemical properties. One such property is the ability of some nanoparticles to emit light. For instance, CdS nanoparticles have been used on photoconducting materials to increase photoconductivity and also to produce light emitters. Typically, photoluminescence of quantum dots of nanoparticles is accomplished by irradiating the quantum dot with light of a frequency that results in emission of light at a different, lower frequency. The nanoparticle quantum dots are typically incorporated into structures such as diodes to enhance the photoluminescence of the structures. Such structures are typically much larger than nanoparticle size. The nanoparticles are usually coated on the structures by a sol-gel type reaction.

A drawback to photoluminescence of semiconductor dots is that the emitted light is typically not polarized. For instance, the aspect ratio of light emitted from the quantum dot is typically too low for polarization. Further drawbacks include the size of the coated structures. For instance, the size of the coated structures may be too large for applications on the nano-scale such as the in-vivo environment. Other drawbacks include the long reaction times typically involved with the sol-gel type reactions Consequently, there is a need for a more efficient process for coating light emitting and/or absorbing semiconductor materials on structures. Other needs include an improved process for illuminating the semiconductor materials. Additional needs include a process for coating light emitting and/or absorbing semiconductor materials on structures that can be used for applications on the nano-scale.

BRIEF SUMMARY OF SOME OF THE PREFERRED EMBODIMENTS

These and other needs in the art are addressed in one embodiment by a method of malting a semiconductor coated nanoparticle comprising a layer of at least one semiconducting material covering at least a portion of at least one surface of a nanoparticle, comprising dispersing the nanoparticle under suitable conditions to provide a dispersed nanoparticle; and depositing at least one semiconducting material under suitable conditions onto at least one surface of the dispersed nanoparticle to produce the semiconductor coated nanoparticle.

In another embodiment, the present invention includes a semiconductor coated nanoparticle comprising a nanoparticle; and a semiconductor coating, wherein the semiconductor coating coats at least a portion of the nanoparticle.

In other embodiments, the nanoparticle comprises a fullerene. Additional embodiments include the semiconductor material comprising CdS or CdSe.

It will therefore be seen that a technical advantage of the present invention includes an improved method for coating nanoparticles capable of emitting light on structures that overcomes the problem of size of the structures as well as allowing non-spherical shapes to be coated by the use of non-spherical nanoparticle substrates. Further advantages include faster reaction times than the typical sol-gel process.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF THE PREFERRED EMBODIMENTS

It has been discovered that semiconducting material capable of emitting and/or absorbing light can be coated on nanoparticle substrates. The present invention provides a method of making a semiconductor coated nanoparticle comprising a layer of at least one semiconducting material covering at least a portion of at least one surface of a nanoparticle, comprising dispersing the nanoparticle under suitable conditions to provide a dispersed nanoparticle; and depositing at least one semiconducting material under suitable conditions onto at least one surface of the dispersed nanoparticle to produce the semiconductor coated nanoparticle. The present invention also provides for a nanoparticle substrate coated with a semiconducting material, with the semiconducting material preferably capable of emitting light. At least a portion of the surface of the nanoparticle substrate can be coated with the semiconducting material, preferably all of the surface.

Preferably, the nanoparticle substrate comprises fullerenes. Fullerenes comprise any carbonaceous material having a structure of a regular, three-dimensional network of fused carbon rings. Such a network of fused carbon rings can be arranged in any suitable structure. Without limiting the invention, examples of such structures include cylindrical, spherical, ovoid, oblate and oblong structures. Typical fullerenes include cylindrical carbon nanotubes and icosahedral $C_{60}$ carbon molecules. Preferably, the fullerenes comprise at least one of $C_{60}$ molecules, $C_{72}$ molecules, $C_{84}$ molecules, $C_{96}$ molecules, $C_{108}$ molecules, $C_{120}$ molecules, ovoid molecules, single-walled carbon nanotubes (SWNTs), and multi-walled carbon nanotubes (MWNTs). More preferably, the fullerenes can be selected from $C_{60}$ molecules, ovoid molecules, and SWNTs. SWNTs comprise one tube about a given center, and MWNTs comprise more than one nested tube about a common center. In alternative embodiments, the fullerene comprises any surface modified fullerene.

Semiconducting materials are well known in the art, and the present invention includes any such semiconducting materials suitable for coating on a nanoparticle substrate.

Preferably, the semiconducting materials are capable of emitting and/or absorbing light, more preferably capable of absorbing and emitting light. Without limiting the present invention, examples of suitable semiconducting materials include photonic bandgap engineered materials; III-V and II-VI binary, ternary, and quaternary compound semiconductors; metallic oxides; polymers; liquid crystals; and suitable organic compounds. Preferably, the semiconducting materials comprise at least one of ZnS, CdS, CdSe, GaAs, InP, GaS, TiO2, and $Fe_2S_3$. More preferably, semiconducting materials comprise at least one of CdS and CdSe. The coated nanoparticle substrate of the present invention comprises any suitable nanoparticle substrate coated with a desired amount of any suitable semiconducting material, preferably capable of emitting and/or absorbing light. A preferable embodiment of the present invention comprises a fullerene coated with CdS or CdSe. A more preferable embodiment of the present invention comprises a SWNT coated with CdS or CdSe.

Without being limited by theory, it has not been demonstrated, but it is believed that providing a hollow quantum dot comprising a semiconducting material, preferably capable of emitting and/or absorbing light, such as CdS, coated on a nanoparticle substrate, such as a SWNT, can result in the emission of light and also can result in an aspect ratio suitable to produce a polarized light emission.

Method of Coating the Nanoparticle Substrate

Dispersing the nanoparticle under suitable conditions to provide a dispersed nanoparticle is accomplished by dispersing the nanoparticle in a liquid. The nanoparticle can be any suitable nanoparticle, preferably a fullerene. Preferably, dispersing the nanoparticle activates at least a portion of at least one surface of the nanoparticle. Without limiting the present invention to any theory, it is believed that dispersing a fullerene activates the surface of the fullerene for deposition of a semiconducting material, preferably one capable of emitting and/or absorbing light. The fullerene is preferably dispersed by chemical functionalization.

Chemical functionalization of a fullerene is well known in the art, and the present invention can include any chemical functionalization technique suitable for dispersing a fullerene and activating its surface. Without being limited by theory, it is believed that chemical functionalization provides at least one specific reactive site for growth of the semiconducting material. Moreover, without limiting the invention, examples of suitable chemical functionalization techniques include hydroxylation. Hydroxylation comprises reacting the surface of the fullerene with a chemical reagent or reagents that result in the formation of a number of hydroxide groups chemically bound to the surface of the fullerene. The hydroxide group is a chemical species consisting of an oxygen and a hydrogen, i.e., OH.

In an alternative embodiment, the fullerene is dispersed by surfactant addition. Suitable surfactants include sodium dodecylsulfate (SDS), dodecyltrimethyl ammonium bromide (DTAB), N-hexadecyl-N(2-hydroxy-ethyl)-N,N'-dimethylammonium bromide, sodium dodecyl (benzenesulfonate), and dodecyl(benzene)trimethylammonium halide. Preferably, the surfactants comprise sodium dodecylsulfate and/or dodecyltrimethyl ammonium bromide. Surfactant addition comprises dispersing the fullerene in a water solution of the surfactant. This can be accomplished by the addition of heat or through sonic waves.

Depositing at least one semiconducting material under suitable conditions onto at least one surface of the dispersed nanoparticle, preferably a fullerene, is accomplished by catalyzing growth of the semiconducting material on the activated surface of the nanoparticle. Catalyzing such growth comprises contacting the dispersed fullerene with a solution comprising chemical precursors to the semiconducting material. Preferably, the nanoparticle substrate is at least partially dissolved in the solution. It is also preferable to use a non sol-gel approach to allow seeded growth on the surface of the fullerene and have a faster reaction time than a typical sol-gel approach. The solution comprises chemical precursors that react to generate the desired semiconducting material. For instance, when the semiconducting material comprises CdS, the CdS solution can be prepared by the following Equation (1), where TEA is triethanolamine.

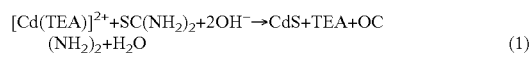

$$[Cd(TEA)]^{2+}+SC(NH_2)_2+2OH^-\rightarrow CdS+TEA+OC(NH_2)_2+H_2O \tag{1}$$

In another example, when the semiconducting material comprises CdSe, the CdSe solution can be prepared by the following Equation (2),

$$CdO+SePBu_3\rightarrow CdSe+OPBu_3 \tag{2}$$

Preferably, capping agents are used to control the surface growth. Capping agents can include at least one of n-tetradecylphosphonic acid, ethanol, and organic thiols of the general formula RSH, where R is an organic group, which is preferably n-tetradecylphosphonic acid. Without being limited by theory, it is believed that the capping agents act as surfactants to the fullerene and also slow and control the growth of the semiconducting material by weakly binding to the surface of the growing material. Capping agents are preferably added to the solution in excess, preferably at least in a ratio of 4:1 with regard to the metal source, e.g., the Cd precursor compound in the synthesis of CdSe.

The semiconducting material is grown on the fullerene until the desired thickness of the coating is achieved. Preferably, the nanoparticle coating is between 0.1-50 μm thick, more preferably less than 10 μm thick. After the desired thickness is achieved, the coating reaction is quenched, and the coated fullerenes can be removed from the solution. The coated fullerenes can be removed by any suitable technique, preferably by centrifuge. Preferably, the coated fullerene is then purified by re-dispersing the fullerene in a suitable solvent such as ethanol.

To further illustrate various illustrative embodiments of the present invention, the following examples are provided.

EXAMPLES

Examples 1-13

CdS Fullerenols

Examples 1-13 demonstrate the coating of fullerenols by CdS.

Experiment 1

A $[Cd^{2+}]$ bath concentration was set at 50 mM. Only triethanolamine (TEA) ratios were varied to avoid colloidal (precipitation) regime of CdS deposition from the bath. Relative molar ratios of Cd:TEA:$NH_4OH$:thiourea were set at 1:3.75:14.4:1, respectively. A typical experiment involved adding 10 mL of a 50 mg/L solution of fullerenols [$C_{60}(OH)_n$] to a centrifuge tube. $NH_4OH$, TU, TEA, and cadmium acetate were added in the respective order to the fullerenol solution, which produces the aforementioned 1 ($Cd^{2+}$):3.75 (TEA):14.4 ($NH_4OH$):1 (thiourea) relative molar ratios with [$Cd^{2+}$] set at 50 mM. Therefore, in this example, [$Cd^{2+}$]=50 mM, [TEA]=187.5 mM, [$NH_4OH$]=

720 mM, and [thiourea]=50 mM. Reagents were reacted without stirring in 50 mL centrifuge tubes with a water bath held at 60° C. for 8 hours. It was allowed to cool to room temperature. All bath final volumes were 30 mL. Results include a colloid of 1.5 μm and an orange deposit on the walls. In addition, a large amount of precipitate was produced and a clear liquid supernatent was observed.

Experiment 2

Bath conditions were identical to Experiment 1, except for changing the TEA relative ratio from 3.75 to 1.875 (93.75 mM). Results include a colloid size of 2-2.5 μm. In addition, other colloid sizes were polydispersed as low as 400 nm.

Experiment 3

Bath conditions were similar to Experiment 1. All bath reagent concentrations diluted 10-fold (5 mM $Cd^{2+}$; 1:3.75:14.4:1 relative molar ratios of $Cd^{2+}$:TEA:$NH_4OH$:thiourea). 5 mL of 50 mg/L fullerenol seed was used. Baths were reacted without stirring at room temperature for 12 hours. The bath final volumes were 30 mL. The resulting CdS appeared amorphous.

Experiment 4

Bath conditions were identical to Experiment 3, except for the omission of 5 mL of added fullerenol seed. This was an unseeded (control) bath. The resulting CdS appeared amorphous.

Experiment 5

Bath conditions were identical to Experiment 4 (unseeded), but the [$Cd^{2+}$] equaled 12.5 mM. The 1:3.75:14.4:1 relative molar ratios of $Cd^{2+}$:TEA:$NH_4OH$:TU were maintained. The resulting CdS appeared bulky and amorphous with no colloids.

Experiment 6

Bath conditions were identical to Experiment 5, but the [$Cd^{2+}$] equaled 25 mM. The resulting CdS appeared bully and amorphous with no colloids.

Experiment 7

Bath conditions were identical to Experiment 5, but the [$Cd^{2+}$] equaled 37.5 mM. It appeared that the bulk texture changed to a colloidal nature.

Experiment 8

Bath conditions were identical to Experiment 5, but the [$Cd^{2+}$] equaled 50 mM. The experiment resulted in colloidal CdS colloids with more monodispersed colloids later seen.

Experiment 9

Bath conditions were identical to Experiment 8, but 10 mL of 50 mg/L fullerenol seed solution was added. Results included all colloids, with a colloid size of 1-1.6 μm. Also, larger 2-2.6 μm colloids were seen. The colloids were polydispersed.

Experiment 10

Bath conditions were identical to Experiment 8, but 5 mL of 50 mg/L fullerenol seed solution was added. Results included all polydispersed colloids. Also, larger 2.6 μm colloids were present with small 300-800 nm colloids.

Experiment 11

Bath conditions were identical to Experiment 10, but the $Cd^{2+}$ concentration was changed to 37.5 mM. Results included polydispersed colloids with sizes of 2.5-3 μm.

Experiment 12

Bath conditions were identical to Experiment 10, but the $Cd^{2+}$ concentration was changed to 25 mM. Results included very small monodispersed colloids with a size of 350-600 nm. Results also included the appearance of some non-colloidal deposits.

Experiment 13

Bath conditions were identical to Experiment 10, but the $Cd^{2+}$ concentration was changed to 12.5 mM. Results included no colloids and also an amorphous film-like CdS deposit.

Examples 14-22

CdS SWNTs

Examples 14-22 demonstrate the coating of SWNTs with CdS.

Experiment 14

1 mL of an aqueous 1% (w/w) sodium dodecylsulfate (SDS) solution of SWNTs (25 mg SWNTs/L) was added to a centrifuge tube, followed by the addition of $NH_4OH$ and TU. In a separate tube, a [$Cd^{2+}$(TEA)] solution was made by adding TEA to $Cd(OAc)_2$ and shaking to allow the TEA to complex with the $Cd^{2+}$ cations. This mixture was added dropwise to the SWNT/$NH_4OH$/TU solution to produce the aforementioned 1 ($Cd^{2+}$):3.75 (TEA):14.4 ($NH_4OH$):1 (TU) relative molar ratios, where [$Cd^{2+}$] was set at 5 mM. Therefore, in this example, [$Cd^{2+}$]=5 mM, [TEA]=18.75 mM, [$NH_4OH$]=72 mM, and [TU]=5 mM. Reagents were reacted overnight at room temperature. The CdS coated SWNTs were washed six times by repeated centrifugation/redispersion in absolute EtOH. All bath final volumes were 1.6 mL.

Experiment 15

Bath conditions were identical to Experiment 14, but the [$Cd^{2+}$] equaled 0.5 mM. The 1:3.75:14.4:1 relative molar ratios of $Cd^{2+}$:TEA:$NH_4OH$:TU were maintained.

Experiment 16

Bath conditions were identical to Experiment 14, but the [$Cd^{2+}$] equaled 0.8 mM.

Experiment 17

Bath conditions were identical to Experiment 14, but the [$Cd^{2+}$] equaled 1 mM.

Experiment 18

Bath conditions were identical to Experiment 14, but the [$Cd^{2+}$] equaled 1.5 mM.

Experiment 19

Bath conditions were identical to Experiment 14, but the [$Cd^{2+}$] equaled 2.5 mM.

Experiment 20

Bath conditions were identical to Experiment 14, but the [$Cd^{2+}$] equaled 7.5 mM.

Experiment 21

Bath conditions were identical to Experiment 14, but the [$Cd^{2+}$] equaled 10 mM.

Experiment 22

Bath conditions were identical to Experiment 14, but the [$Cd^{2+}$] equaled 25 mM.

Experiment 22

Bath conditions were identical to Experiment 14, but the [$Cd^{2+}$] equaled 28 mM.

Examples 23-26

CdSe SWNTs

Examples 23-26 demonstrate the coating of SWNTs with CdSe.

Experiment 23

In a 50 mL centrifuge tube, 25 mg annealed HiPCO SWNTs was added. The tubes had been previously annealed under argon in a sealed tube furnace at 800° C., cooled, and gently ground. 30 mL of 1-octadecene (ODE) was added, and the tubes were vigorously sonicated for 20 seconds. After 30 seconds of settling, the tube was slightly swirled to suspend the SWNTs but not to disturb large settled chunks of undispersed SWNTs. The top 15 mL of the suspension was quickly transferred by pipet to a 50 mL Schlenk flask. 71.4 mg (256 μmol) tetradecylphosphonic acid (TDPA) and 8.2 mg (64 μmol) CdO was added to this suspension. This mixture was heated with stirring under argon to 300° C. to dissolve the CdO and then cooled to 250° C. At this point, 0.08 g of an $SePBu^3$ mixture (containing 2.53 mg (32 μmol) Se, 9.5 mg tetrabutylphosphine (TBP), 72.4 mg trioctylphosphine (TOP), and 15 mg toluene) was injected into the flask, and the reaction was allowed to proceed at 250° C. until completion (ca. 30 min), at which point the heating mantle was removed. The room temperature SWNT suspension was then extracted with an equal portion of MeOH/$CHCl_3$ (1:1) several times to remove excess Cd-TDPA complex. Absolute EtOH was added to the ODE/SWNT portion (~30 mL) to precipitate the tubes. Finally, the tubes were washed six times by repeated centrifugation/redispersion in EtOH.

Experiment 24

Experimental conditions were identical to those of Experiment 23, except that oleic acid (73 mg, 256 μmol) was substituted for TDPA as the complexing agent for cadmium.

Experiment 25

Experimental conditions were similar to those of Experiment 23, except that trioctylphosphine oxide (TOPO) was used as the solvent rather than ODE. The SWNTs were added to a hot (84° C.) melt of 5 g TOPO, and sonicated in a large test tube. After 10 seconds of settling, the top 80% of the suspension was quickly transferred by pipet to a 50 mL Schlenk flask and to this suspension was added 71.4 mg (256 μmol) tetradecylphosphonic acid (DPA) and 8.2 mg (64 μmol) CdO. This mixture was heated with stirring under argon to 300° C. to dissolve the CdO and then cooled to 250° C. At this point, 0.08 g of an Se-TBP mixture (containing 2.53 mg (32 nmol) Se, 9.5 mg tetrabutylphosphine (TBP), 72.4 mg trioctylphosphine (TOP), and 15 mg toluene) was injected into the flask, and the reaction was allowed to proceed at 250° C. until completion (ca. 30 min), at which point the heating mantle was removed. When the melt had cooled to ca. 60° C., a large excess of toluene was added (~40 mL). This mixture was centrifuged, the supernatent discarded, and the tubes were washed 6 times by repeated centrifugation/redispersion in EtOH.

Experiment 26

Experimental conditions were identical to those of Experiment 25, except that oleic acid (73 mg, 256 μmol) was substituted for TDPA as the complexing agent for cadmium.

It will be understood that the present invention is not limited to the nanoparticle substrate comprising fullerenes. In alternative embodiments, the present invention comprises any inert nanoparticles. A preferable example of such an inert nanoparticle is an alumoxane. Additional examples include a fullerene coated with gold (or any other metal), an oxide, or a dielectric.

Even though it has not been demonstrated that the present invention produces light or polarized light from the nanoparticle substrate coated with the semiconducting materials, it is believed that such an invention could be functionalized for use with in vivo applications. Examples of such in vivo applications include disabling or destroying foreign bodies in the blood and lymph systems such as parasites, bacteria, viruses and pathogenic proteins; physical alteration or destruction of specific biomolecular structures such as cholesterol deposits on the interior of veins and arteries, as well as intracellular pathogens; cauterization of blood vessels without the need for invasive surgical techniques; photon-assisted wound healing; photon-assisted reconstruction of severed nerve tissue site specific molecular identification for diagnostic purposes; and the like. It is further believed but has not been demonstrated that the nanoparticle substrate coated with the semiconductor materials of the present invention can have the wavelength of emitted light selected for maximum effectiveness by the choice of nanoparticle and/or semiconductor materials and deposition parameters, and that it can be directly injected into targeted structures or can be fed intravenously.

Although the present invention and its advantages have been described in detail, it should be understood that various changes, substitutions and alterations may be made herein without departing from the spirit and scope of the invention as defined by the appended claims.

What is claimed is:

1. A method of making a semiconductor coated nanoparticle comprising a layer of at least one semiconducting material covering at least a portion of at least one surface of a nanoparticle, comprising:
   (A) dispersing the nanoparticle under suitable conditions to provide a dispersed nanoparticle; and
   (B) depositing at least one semiconducting material under suitable conditions onto at least one surface of the dispersed nanoparticle to produce the semiconductor coated nanoparticle.

2. The method of claim 1, wherein the fullerene comprises at least one of $C_{60}$ molecules, $C_{72}$ molecules, $C_{84}$ molecules, $C_{96}$ molecules, $C_{108}$ molecules, $C_{120}$ molecules, ovoid molecules, single-walled carbon nanotubes, and multi-walled carbon nanotubes.

3. The method of claim 1, wherein the fullerene comprises a surface modified fullerene.

4. The method of claim 1, wherein the at least one surface of the dispersed nanoparticle is activated.

5. The method of claim 1, wherein the semiconducting material comprises at least one of ZnS, CdS, CdSe.

6. The method of claim 1, wherein the semiconducting material comprises at least one of CdS and CdSe.

7. The method of claim 1, wherein the semiconducting material is capable of at least one of absorbing and emitting light.

8. The method of claim 1, wherein dispersing the nanoparticle is accomplished by chemical functionalization.

9. The method of claim 8, wherein chemical functionalization comprises hydroxylation.

10. The method of claim 1, wherein dispersing the nanoparticle is accomplished by surfactant addition.

11. The method of claim 10, wherein the surfactant comprises at least one of sodium dodecylsulfate, dodecyltrimethyl ammonium bromide, N-hexadecyl-N(2-hydroxyethyl)-N,N'-dimethylammonium bromide, sodium dodecyl (benzenesulfonate), and dodecyl(benzene) trimethylammonium halide.

12. The method of claim 1, wherein depositing of step (13) comprises contacting the at least one surface with a solution comprising precursors to the semiconducting material.

13. The method of claim 1, wherein step (B) further comprises adding at least one capping agent to the solution.

14. The method of claim 13, wherein the at least one capping agent comprises at least one of n-tetradecylphosphonic acid, ethanol, and an organic thiol.

15. The method of claim 1, wherein step (3) further comprises catalyzed growth of the semiconducting material onto the at least one surface.

16. The method of claim 15, further comprising (C) quenching the catalyzed growth.

17. The method of claim 1, further comprising (C) inserting the semiconductor coated nanoparticle in vivo.

* * * * *